(12) United States Patent
Sakai et al.

(10) Patent No.: US 10,475,493 B2
(45) Date of Patent: Nov. 12, 2019

(54) WORD-LINE PRE-CHARGING IN POWER-ON READ OPERATION TO REDUCE PROGRAMMING VOLTAGE LEAKAGE

(71) Applicant: SanDisk Technologies LLC, Plano, TX (US)

(72) Inventors: Manabu Sakai, San Jose, CA (US); Qui Vi Nguyen, San Jose, CA (US); Yen-Lung Li, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/844,037

(22) Filed: Dec. 15, 2017

(65) Prior Publication Data

US 2019/0066789 A1    Feb. 28, 2019

Related U.S. Application Data

(60) Provisional application No. 62/548,893, filed on Aug. 22, 2017.

(51) Int. Cl.
| | |
|---|---|
| *G11C 8/08* | (2006.01) |
| *G11C 16/08* | (2006.01) |
| *G11C 5/14* | (2006.01) |
| *G11C 16/26* | (2006.01) |
| *G11C 16/30* | (2006.01) |
| *G11C 16/04* | (2006.01) |

(52) U.S. Cl.
CPC ............... *G11C 8/08* (2013.01); *G11C 5/148* (2013.01); *G11C 16/08* (2013.01); *G11C 16/26* (2013.01); *G11C 16/0483* (2013.01); *G11C 16/30* (2013.01)

(58) Field of Classification Search
CPC ...... G11C 16/08; G11C 16/0483; G11C 16/30
See application file for complete search history.

(56) References Cited

U.S. PATENT DOCUMENTS

| | | | |
|---|---|---|---|
| 7,414,895 B2 | 8/2008 | Aritome | |
| 7,471,556 B2 | 12/2008 | Chow et al. | |
| 8,705,273 B2* | 4/2014 | Kim | G11C 5/14 365/185.03 |
| 8,854,890 B1 | 10/2014 | Miwa | |
| 2009/0290429 A1 | 11/2009 | Dong et al. | |
| 2014/0098611 A1* | 4/2014 | Tanzawa | G11C 16/0483 365/185.13 |
| 2015/0132917 A1* | 5/2015 | Siau | G11C 5/02 438/382 |

* cited by examiner

*Primary Examiner* — David Lam
(74) *Attorney, Agent, or Firm* — Foley & Lardner LLP

(57) ABSTRACT

This disclosure provides techniques for reducing leakage current in a non-volatile memory that does not include a local interconnect. In one example, a low-voltage pulse can be applied to all of the word-lines in all of the blocks of the non-volatile memory. The low-voltage pulse can be applied during a period in which the row decoder is typically idle in order to reduce the total amount of time required to program the non-volatile memory. After the conclusion low-voltage pulse, a global control line voltage can be applied at about the same level as the low-voltage pulse to keep the word-lines floating when the pulse is no longer applied.

21 Claims, 6 Drawing Sheets

WORD-LINE PRE-CHARGING IN POWER-ON READ OPERATION TO REDUCE PROGRAMMING VOLTAGE LEAKAGE

CROSS-REFERENCE TO RELATED APPLICATIONS

This application claims the benefit of and priority to U.S. Provisional Application No. 62/548,893, entitled "WORD-LINE PRE-CHARGING IN POWER-ON READ BACKGROUND TO REDUCE PROGRAMMING VOLTAGE LEAKAGE" and filed on Aug. 22, 2017, the entire contents of which are incorporated herein by reference.

BACKGROUND

The present disclosure relates to technology for non-volatile storage.

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, it is desirable to minimize the amount of power used by the semiconductor memory in order to conserve the battery of the host electronic device. Additionally, consumers want the semiconductor memory to perform reliably at sufficient speeds. Therefore, management of power consumption and programming speed is imperative to more reliable data and a better customer experience.

SUMMARY

The systems, methods and devices of this disclosure each have several innovative aspects, no single one of which is solely responsible for the desirable attributes disclosed herein.

One aspect of this disclosure is directed to an apparatus. The apparatus can include a plurality of memory cells. The apparatus can include a plurality of word lines connected to the plurality of memory cells. The apparatus can include a low-voltage generator configured to apply a low-voltage pulse to at least one of the plurality of word lines during a time period prior to a first programming operation of at least one of the plurality of memory cells to pre-charge the at least one word line.

In some implementations, the apparatus can be configured to apply a voltage having substantially the same magnitude as the low-voltage pulse to a global control line after termination of the low-voltage pulse. In some implementations, the apparatus can include a row decoder. The low-voltage generator can be configured to supply the low-voltage pulse when the row decoder is idle.

In some implementations, the time period can include a power-on read operation including a read operation, a ROM data loading operation, a bad block management operation, and a bad column replacement operation. In some implementations, the low-voltage generator can be configured to apply the low-voltage pulse during one of the ROM data loading operation and the bad column replacement operation.

In some implementations, the low-voltage generator can be configured to apply the low-voltage pulse to all of the word-lines in the at least one memory cell. In some implementations, the low-voltage pulse can have a voltage in the range of about 0.8 V to about 1.2 V. In some implementations, the low-voltage pulse can have a duration in the range of about 700 microseconds to about 900 microseconds.

Another aspect of this disclosure is directed to a system. The system can include a plurality of memory cells. The system can include a plurality of word lines connected to the plurality of memory cells. The system can include a row decoder. The system can include a low-voltage generator configured to apply a low-voltage pulse to all of the plurality of word lines of at least one of the plurality of memory cells to pre-charge the plurality of word lines during a time in which the row decoder is idle.

In some implementations, the system can include a plurality of memory blocks each including at least one of the plurality of memory cells. In some implementations, the system can be further configured to apply a WLSW signal having a magnitude greater than that of the low-voltage pulse to activate each of the plurality of memory blocks during a WLSW setup phase, prior to the low-voltage generator applying the low-voltage pulse. In some implementations, the low-voltage generator can be configured to initiate the low voltage pulse during a word line development phase occurring at the conclusion of the WLSW setup phase. In some implementations, the low-voltage generator can be further configured to terminate the low-voltage pulse at the conclusion of the word line development phase.

In some implementations, the low-voltage generator can be configured to apply the low-voltage pulse when the system transitions from a sleeping state to an operational state. In some implementations, the low-voltage generator can be configured to apply the low-voltage pulse prior to a first programming operation of the plurality of memory cells.

Another aspect of this disclosure is directed to a method for reducing leakage in a non-volatile memory. The method can include initiating, by a low-voltage generator at a beginning of an idle period of a row decoder, a low-voltage pulse to a plurality of word-lines of the non-volatile memory. The method can include terminating, by the low-voltage generator at an end of the idle period of the row decoder, the low-voltage pulse. The method can include applying a voltage having substantially the same magnitude as the low-voltage pulse to a global control line after the end of the idle period of the row decoder. The method can include programming a memory cell of the non-volatile memory via at least one of the plurality of word-lines.

In some implementations, the method can include initiating, by the low-voltage generator, the low-voltage pulse during a power-on read operation. In some implementations, the method can include initiating, by the low-voltage generator, the low-voltage pulse during a ROM data loading operation of the power-on read operation. In some implementations, the method can include initiating, by the low-voltage generator, the low-voltage pulse during a bad column replacement operation of the power-on read operation. In some implementations, the low voltage pulse can have a magnitude in the range of about 0.8 V to about 1.2 V and a duration in the range of about 700 microseconds to about 900 microseconds.

Another aspect of this disclosure is directed to an apparatus. The apparatus can include a plurality of memory cells. The apparatus can include a plurality of word lines connected to the plurality of memory cells. The apparatus can include means for applying a low-voltage pulse to at least one of the plurality of word lines prior to a first programming operation of at least one of the plurality of memory cells to pre-charge the at least one word line. The apparatus can also include means for applying a voltage having substantially the same magnitude as the low-voltage pulse to a global control line after termination of the low-voltage pulse.

DETAILED DESCRIPTION

Figure 1:
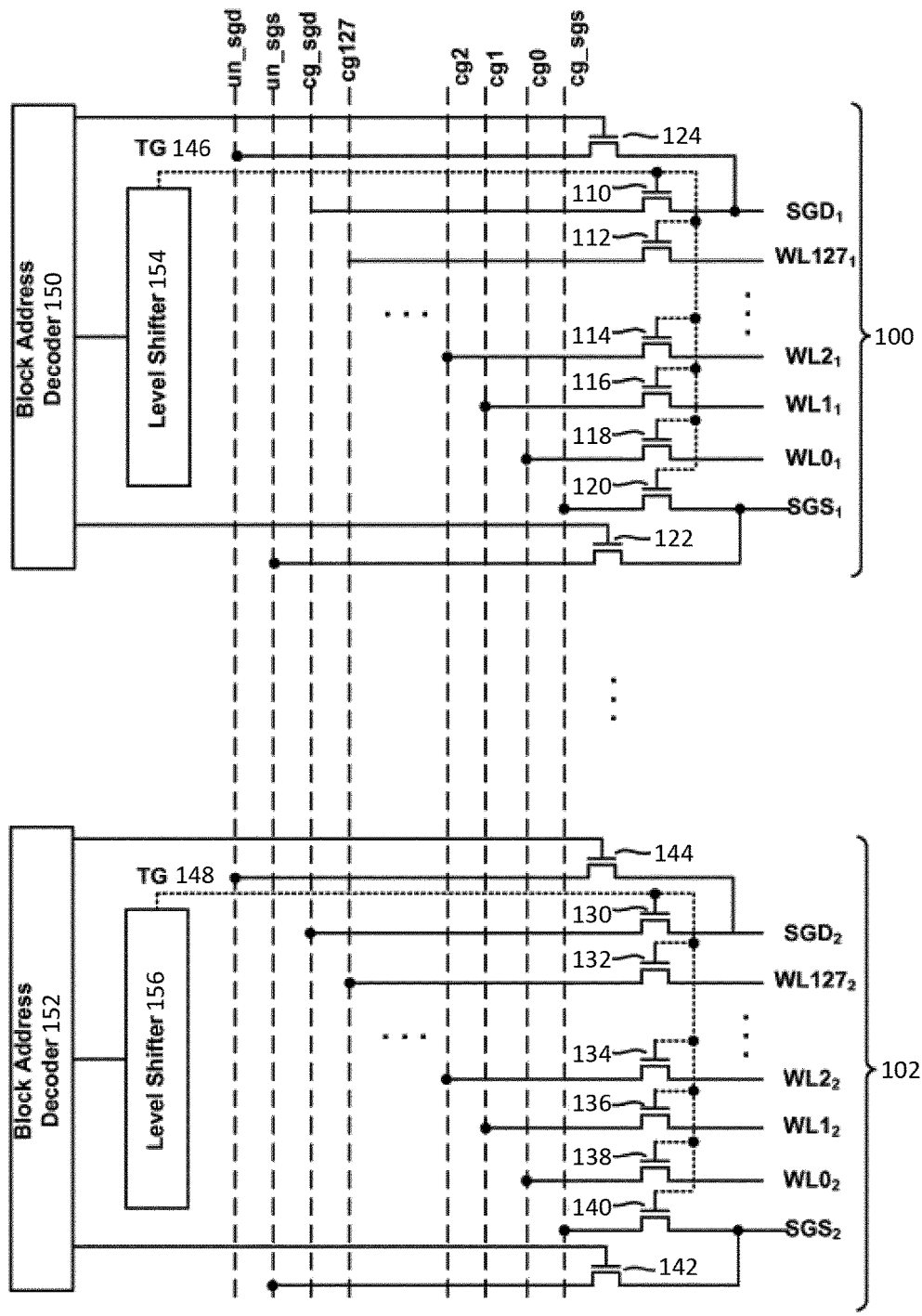
FIG. 1 is a block diagram depicting the connection of word lines to global control lines from multiple blocks of memory cells, according to an example implementation.

Reference will now be made to various embodiments, one or more examples of which are illustrated in the figures. The embodiments are provided by way of explanation of the invention, and are not meant as a limitation of the invention. For example, features illustrated or described as part of one embodiment may be used with another embodiment to yield still a further embodiment. It is intended that the present application encompass these and other modifications and variations as come within the scope and spirit of the invention.

Disclosed herein is a technology directed to non-volatile memory. The disclosed technology can be used to reduce leakage associated with a programming voltage referred to as VPGM in some architectures for non-volatile memory. In some implementations, VPGM can be about 23 V and may be applied to an active block of the non-volatile memory in order to store information in the active block. A leakage current between global control lines (sometimes referred to as CGI lines) and word-line switching circuitry of the unselected blocks of the non-volatile memory may result from application of VPGM. Generally, a higher leakage current can correspond to a slower word-line development time. In order to ensure quick programming times for the non-volatile memory, it can be desirable to limit the leakage current to a maximum threshold. In some implementations, the maximum leakage current can be in the range of about 300 uA.

The leakage current for unselected blocks is dependent on source voltage. In some architectures, the source voltage may be higher than zero volts due to coupling effects from a local interconnect (LI), which can be biased with a voltage during a programming operation. A local interconnect is a conductive structure that can be positioned close to a word-line. In some architectures, word-lines may be sandwiched between LIs, which may be charged to a voltage of about 0.5 V. As a result of the coupling effects discussed above, the word-lines in such architectures also may be charged to a voltage of around 0.5 V. However, architectures in which the LIs are not present may not experience this coupling effect, resulting in a lower source voltage of about 0 V. This lower source voltage can lead to higher leakage current, which can result in slower programming times as described above.

To address this problem, word-lines can be initialized (i.e., pre-charged to a low voltage) prior to a first program operation to compensate for the lack of coupling effects due to the absence of LIs. In some implementations, the word-lines can be initialized during a power-on read operation. In still other implementations, the word-lines can be initialized when the memory device moves from a sleeping state to an operational state. For example, a low-voltage pulse can be applied to the word-lines for a specified amount of time in order to pre-charge the word-lines. In some implementations, the low-voltage pulse can be about 1 V, and can be applied to all word-lines in all blocks of the non-volatile memory. In some implementations, the low-voltage pulse can be in the range of about 0.8 V to about 1.2 V, and can have a duration in the range of about 700 µs to about 900 µs. To reduce the time required to pre-charge the word-lines in this manner, the low-voltage pulse can be applied to all word-lines substantially simultaneously. In some implementations, the pre-charge voltage level of the word-lines can be maintained after the low-voltage pulse is terminated by continuing to apply the same low-voltage level to the global control lines after the termination of the low-voltage pulse on the word-lines. An example diagram showing an architecture that may be useful for the systems and methods of this disclosure is described further below in connection with FIG. 1.

FIG. 1 is a block diagram depicting the connection of word lines to global control lines from multiple blocks of memory cells, according to an example implementation. In this example, each block includes 128 word lines (and 128 data memory cells in a NAND string). There are 132 global control lines including un_sgd, un_sgs, cg_sgd, cg127, . . . cg2, cg1, cg0, cg_sgs (depicted as dashed lines for illustrative purposes). These global control lines receive voltages from charge pumps or other voltage providing circuits and transport those voltages to the word lines for selected blocks of memory cells.

For example, cg0 can be selectively connected to WL1 of any block, cg1 can be selectively connected to WL1 of any block, . . . cg127 can be selectively connected to WL127 of any block of memory cells. The signals cg_sgs and cg_sgd connect to sgs and sgd, respectively, of any selected block. The signals un_sgd and un_sgs are used to prevent unselected blocks from conducting any current, as will be discussed below.

Block 100 includes word lines $WL0_1$, $WL1_1$, $WL2_1$, . . . $WL127_1$, and block 102 includes word lines $WL0_2$, $WL1_2$, $WL2_2$, . . . $WL127_2$. Note that the memory system may have more than two blocks (as implied by the ellipsis). However, two blocks are depicted to make the drawing readable. Each of the blocks includes a set of word line switches that interface between the word lines (and control lines SGS and SGD) and the global control lines.

For example, block 100 includes word line switches 110, 112, . . . , 114, 116, 118 and 120. Block 102 includes word line switches 130, 132, . . . , 134, 136, 138 and 140. In one embodiment, each of the word line switches is a transistor. In other embodiments, other types of switches can be used. The drain of each of the word line switches are connected to the respective word line, and the source of the respective word line switches are connected to the respective global control lines.

For example, word line switch 114 has its source connected to cg2 and its drain connected to $WL2_1$. The gates of the word line switches 110-120 of block 100 are all connected to the same gate line TG 146. The gates of word line switches 130-140 of block 102 are all connected to the same gate line TG 148. Gate line TG 146 and gate line TG 148 are depicted as dotted lines only for purposes of making the drawing easier to read.

Row decoders can include block address decoders 150 and 152 depicted in FIG. 1, which decode whether their respective blocks are selected for a memory operation (e.g., read, program, erase). If so, the respective block address decoder 150 and 152 will instruct the connected level shifters 154 and 156, respectively, to generate the appropriate signals on the TG line.

If block 100 is selected for erase, then appropriate voltages will be placed on the global control lines (e.g., cg0-cg127) and Level Shifter 154 asserts a HIGH voltage on TG 146 so that word line switches 110-120 turn ON and connect word lines $WL0_1$, $WL1_1$, $WL2_1$, ... $WL127_1$ to the global control lines cg0-cg127. If block 102 is not selected for being erased, then level shifter 156 will assert a LOW voltage on TG line 148 so that the word line switches 130-140 all remain OFF and word lines $WL0_2$, $WL1_2$, $WL2_2$, ... $WL127_2$ are floated (and electrically isolated from the global control lines (cg0-cg127).

Figure 2A:
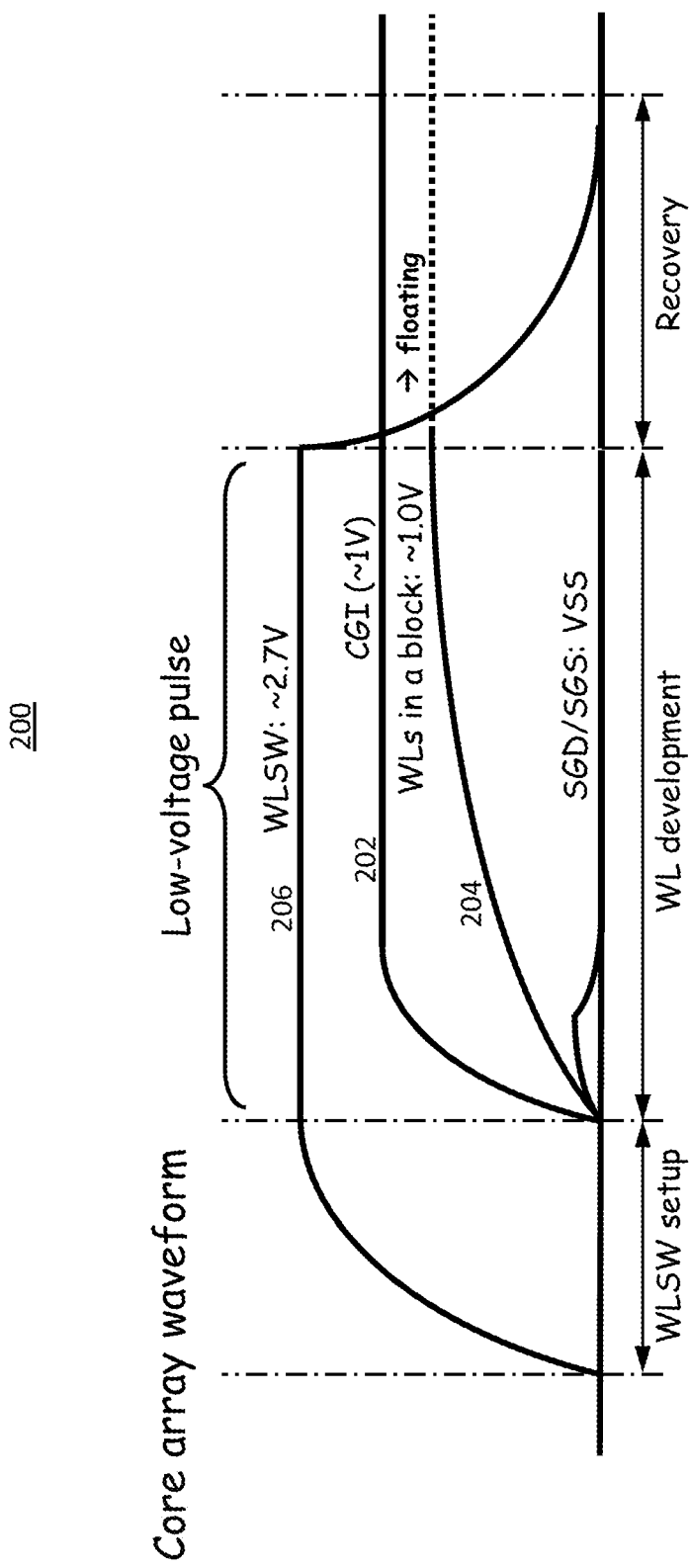
FIG. 2A is a graph depicting various waveforms in one implementation of a non-volatile memory system.
Figure 2B:
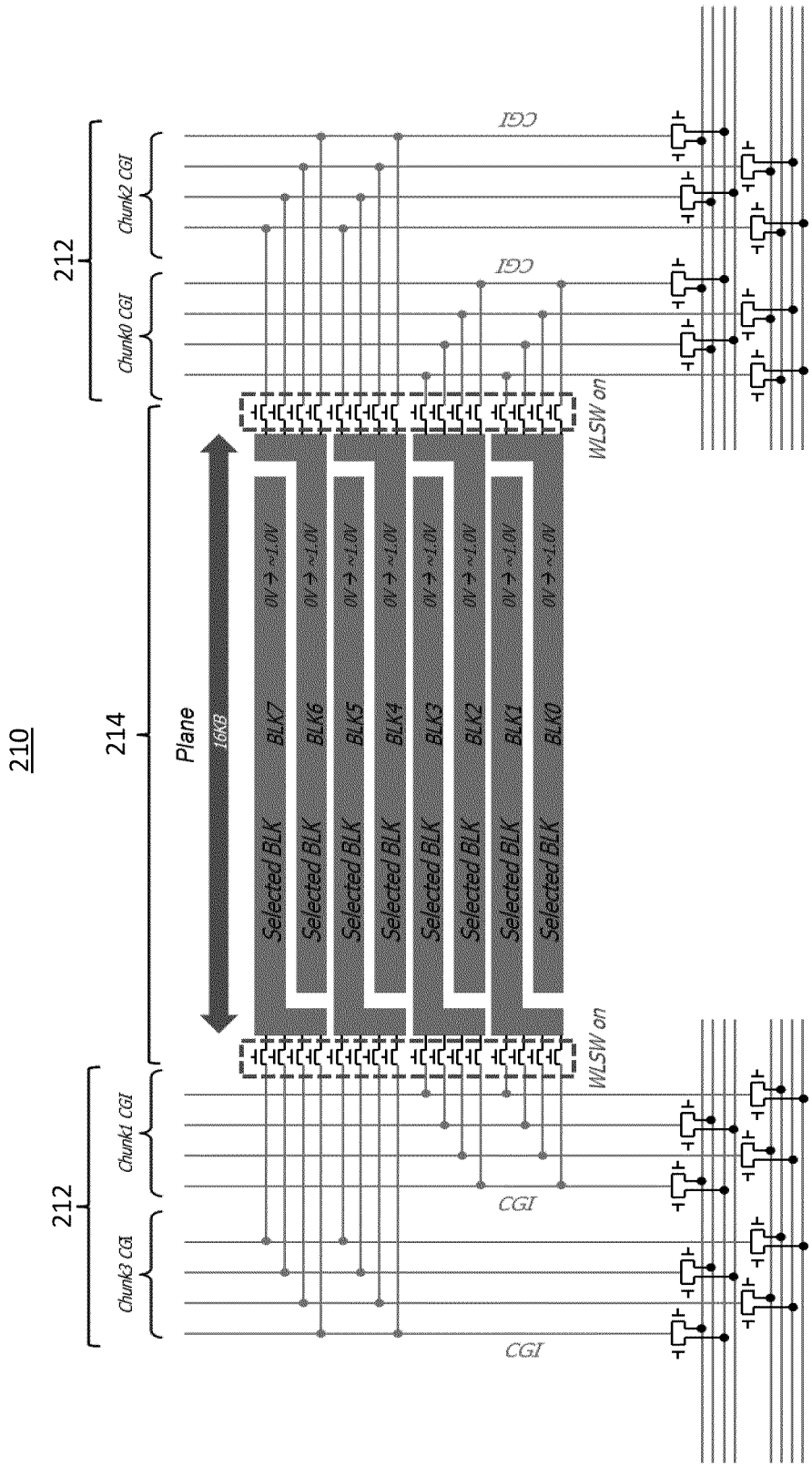
FIG. 2B depicts a schematic diagram of the circuitry to which the waveforms of FIG. 2A are applied in an example implementation.
Figure 2C:
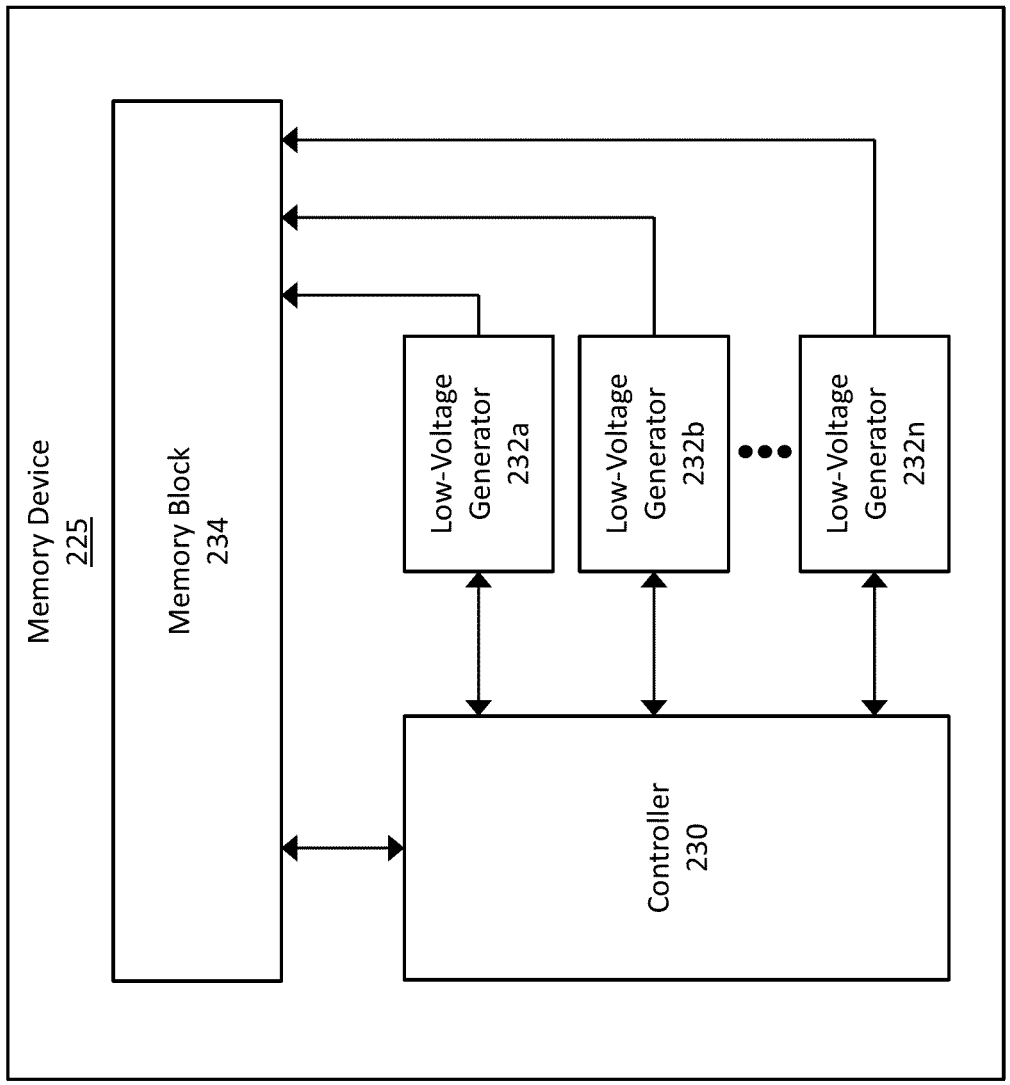
FIG. 2C is a block diagram of a system that can include the circuitry shown in FIG. 2B and can be used to generate at least some of the waveforms shown in FIG. 2A.

FIG. 2A is a graph 200 depicting various waveforms in one implementation of a non-volatile memory system. FIG. 2B depicts a schematic diagram 210 of the circuitry to which the waveforms of FIG. 2A are applied in an example implementation. FIG. 2C is a block diagram of a system that can include the circuitry shown in FIG. 2B and can be used to generate at least some of the waveforms shown in FIG. 2A. FIGS. 2A-2C are described together below.

The CGI waveform 202 of FIG. 2A is applied to the CGI lines 212 (i.e., global control lines) shown in FIGS. 2B, and the word-line waveform 204 shown in FIG. 2A is applied to the word-lines 214 shown in FIG. 2B. Referring to FIG. 2A, the time axis of the graph 200 includes a WLSW setup phase to activate all blocks, a word-line development phase, and a recovery phase. As shown, during the WLSW setup phase, a WLSW signal 206 is increased to a voltage of about 2.7 V, and remains at this level until the end of the word-line development phase. During the word-line development phase, the CGI voltage signal 202 is increased to a voltage of about 1 V. The CGI signal 202 remains at that voltage for the remainder of the word-line (WL) development phase and the recovery phase. Also during the word-line development phase, the low-voltage pulse 204 can be applied to all word-lines in all blocks, as described above. Both the low-voltage pulse and the WLSW signal 206 are turned off at the end of the word-line development phase. In the recovery phase, the CGI voltage 202 is maintained around 1 V to keep the word-lines floating, as shown by broken line remaining at the level of the low-voltage pulse during the recovery phase after the pulse has been terminated.

Thus, in the example shown in FIG. 2A, the low-voltage pulse to reduce leakage current is applied for the duration of the word-line development phase. This extra time can reduce performance and increase overall programming time. To address this issue, in some implementations the low-voltage pulse can be applied during a time when a row decoder is typically idle. Application of the low-voltage pulse during an otherwise idle time can serve to hide the low-voltage pulse operation such that the time required to apply the low-voltage pulse does not add to the overall programming time for the non-volatile memory.

FIG. 2C shows a memory device 225 including components that can be used to generate the waveforms shown in FIG. 2A. The memory device 225 includes a controller 230, a plurality of low-voltage generators 232a-232n (generally referred to as low-voltage generators 232), and a memory block 234. It should be understood that the components shown in FIG. 2C are illustrative only and should not be construed as limiting the scope of this disclosure. For example, in some implementations, the memory device 225 may include more or fewer low-voltage generators 232 than shown, or may include more memory blocks. In some implementations, the memory device 225 includes a plurality of memory blocks 234 and a single low-voltage generator 232 coupled to each of the memory blocks 234.

The memory block 234 can include a plurality of memory cells and associated circuitry for the memory cells, such as one or more row decoders, word lines, global control lines, etc. For example, the memory block 234 can include any of the circuit components shown in the schematic diagram 210 of FIG. 2B or the schematic diagram shown in FIG. 1. The low-voltage generators 232 can be any type or form of device capable of generating a low-voltage pulse. Generally, a low-voltage pulse can be a pulse having a voltage of about 1 V. For example, the low voltage pulse can be in the range of about 0.8 volts to about 1.2 V. In some implementations, the low-voltage generators 232 can be include voltage sources, charge pumps, current sources, batteries, or any other form of electrical power generation devices. The low-voltage generators 232 also can include other circuitry, such as switches configured to open and close to deliver or terminate a voltage signal to any of the electrical components within the memory block 234.

The controller 230 can be configured to cause one or more of the low-voltage generators 232 to produce the low-voltage pulse shown in FIG. 2A. For example, the low-voltage generator 232a can have an output coupled to a word line within the memory block 234. At the beginning of the word line development phase, as illustrated in FIG. 2A, the controller 230 can cause the low-voltage generator 232a to deliver a low-voltage pulse to one or more word lines within the memory block 234, as depicted by the waveform 204. The controller 230 can also cause the low-voltage generator 232a to terminate the low-voltage pulse applied to the one or more word lines at the conclusion of the word line development phase. Thus, in some implementations, the low-voltage generators 232 can serve as a means for applying a low-voltage pulse to at least one of a plurality of word lines in the memory block 234 prior to a first memory operation, such as a programming operation, of at least one of the plurality of memory cells occurring after power is applied to the plurality of memory cells to pre-charge the at least one word line. In some implementations, the first memory operation can be a first memory operation occurring after the memory device 225 is powered on. In some other implementations, the first memory operation can be a first memory operation occurring after the memory device 225 transitions from a sleeping state to an operational state.

In some implementations, the low-voltage generator 232b can have an output coupled to one or more global control lines within the memory block 234. The controller 230 also can cause the low-voltage generator 232b to apply a low-voltage to the global control lines at the end of the word line development phase, to help ensure that the word lines remain floating at a voltage approximately equal to the low-voltage pulse. In some other implementations, the low-voltage pulse delivered to the word lines during the word lines development phase and the low voltage applied to the global control lines after the word line development phase can instead be generated by the same low-voltage generator 232 (e.g., both may be generated by the low-voltage generator 232a). Thus, in some implementations, the low-voltage generators 232 can also serve as a means for applying a voltage having substantially the same magnitude as the low-voltage pulse to one or more global control lines of the memory block 234 after termination of the low-voltage pulse.

The memory device 225 can be implemented using any of a wide variety of types of memory. For example, in some implementations, the memory device 225 can be a flash memory system. A flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. In certain embodiments, the bit line runs on top of the NAND strings in a direction perpendicular to the word lines and is connected to a sense amplifier.

Other types of non-volatile storage devices, in addition to NAND flash memory, can also be used to implement the memory device 225 making use of the new technology described herein. For example, a TANOS structure (consisting of layers of TaN—Al2O3-SiN—SiO2 on a silicon substrate), which is a memory cell configured to trap charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. No. 7,005,350 discloses a non-volatile memory cell having a trapping dielectric sandwiched between two silicon dioxide layers. Multi-state data storage is implemented by separately reading the binary states of the spatially separated charge storage regions within the dielectric.

Other types of non-volatile memory technologies may also be used in conjunction with the technology disclosed herein. For example, any suitable type of solid-state storage media may be used, such as, among others, NOR flash memory, nano RAM ("NRAM"), magneto-resistive RAM ("MRAM"), phase change RAM ("PRAM"), Racetrack memory, Memristor memory, nanocrystal wire-based memory, silicon-oxide based sub-10 nanometer process memory, graphene memory, Resistive random-access memory ("RRAM"), programmable metallization cell ("PMC"), and conductive-bridging RAM ("CBRAM").

One example of a ReRAM memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figure 3:
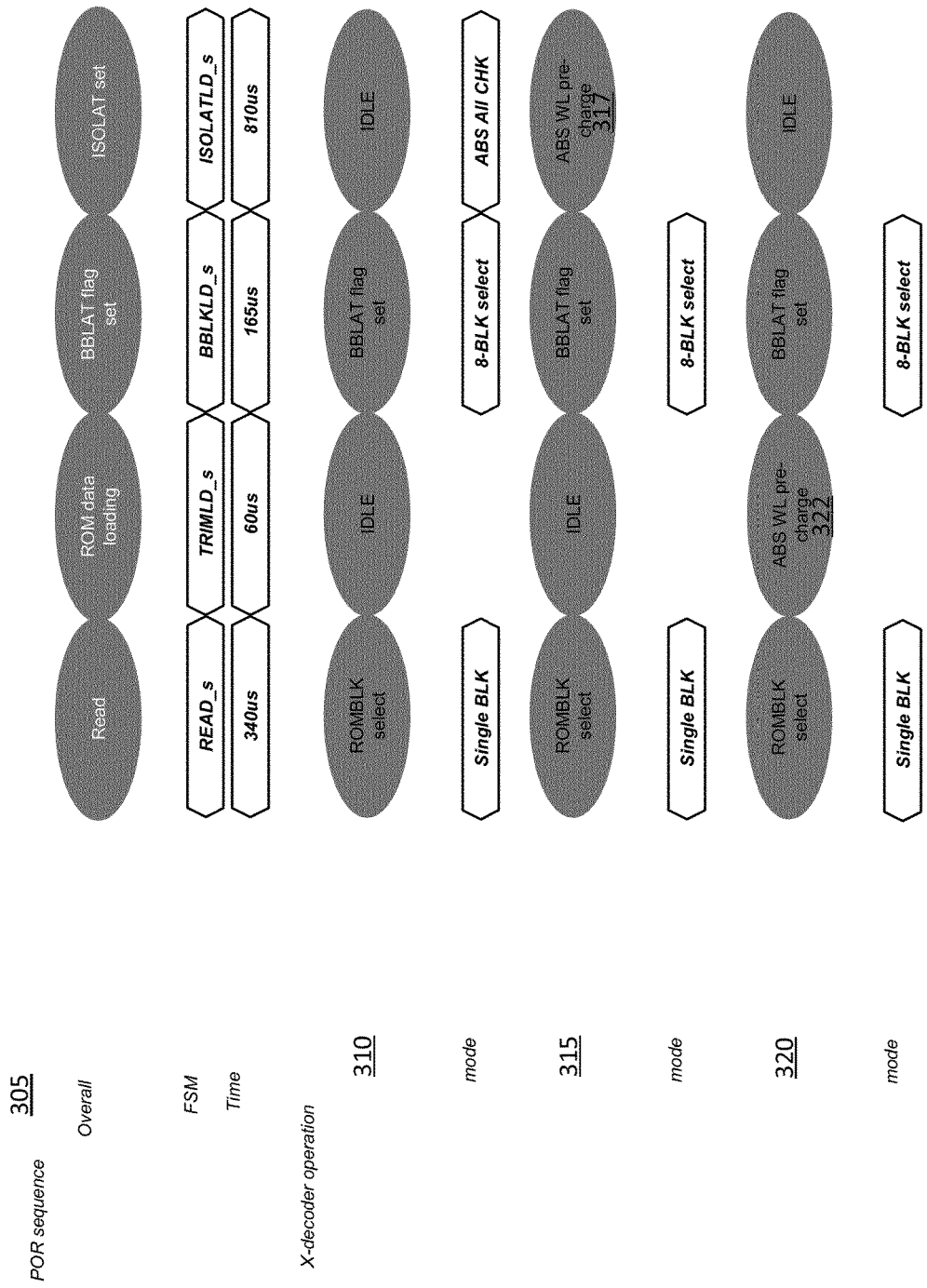
FIG. 3 is a series of timing diagrams of operations performed in various implementations of a non-volatile memory system.

FIG. 3 is a series of timing diagrams of operations performed in various implementations of a non-volatile memory system. The timing diagrams of FIG. 3 show an example in which the low-voltage pulse is applied during a portion of a power-on read (POR) sequence. The timing diagram 305 shows the operations performed during the POR sequence, as well as the times required to complete the operations. For example, the POR sequence includes a read operation in which fuse ROM data is retrieved from a ROM data region in the memory array, a ROM data loading operation in which the retrieved fuse ROM data is loaded to an applicable data-latch, a BBLAT flag set operation in which bad blocks are marked based on the retrieved fuse ROM data, and an ISOLAT set operation in which defective bit-lines are marked as bad based on the retrieved fuse data.

In some implementations, the BBLAT flag set operation can also be referred to as a "bad block management" operation. In some implementations, the ISOLAT set operation can be referred to as a "bad column replacement" operation.

All of the operations illustrated in FIG. 3 are depicted along a common time axis in a horizontal direction. Therefore, the timing diagram 310 shows the operations of the row decoder (labeled x-decoder in FIG. 3) during the same time periods in which the operations of the POR sequence are performed. As shown, the row decoder includes two idle periods, during the ROM data loading operation and the ISOLAT set operation of the POR sequence. The ISOLAT set operation has a time budget of 810 μs, which is substantially longer than the duration of the idle period during the ROM data loading operation and can be sufficient for applying the low-voltage pulse to pre-charge the word-lines as discussed above. Thus, the timing diagram 315 shows an additional operation 317 for pre-charging the word-lines during this period. By applying the low-voltage pulse in this manner, no additional time is consumed by the POR sequence. Therefore, the low-voltage pulse can be applied to the word-lines to reduce leakage current without adding to the programming time.

It should be understood that, in some implementations, the low-voltage pulse can be applied to the word-lines during a different idle period of the row decoder. For example, as illustrated by the timing diagram 320, the additional operation 322 to pre-charge the word-lines can instead be performed during the shorter ROM data loading period, during which the row decoder is otherwise idle. In addition, in some implementations the low-voltage pulse can be applied to the word-lines outside of a power-on read operation. For example, in some implementations the low-voltage pulse can be applied when the device transitions from a sleeping state to an operational state. Generally, the low-voltage pulse can be applied prior to (or at the beginning of) a first memory operation.

Figure 4:
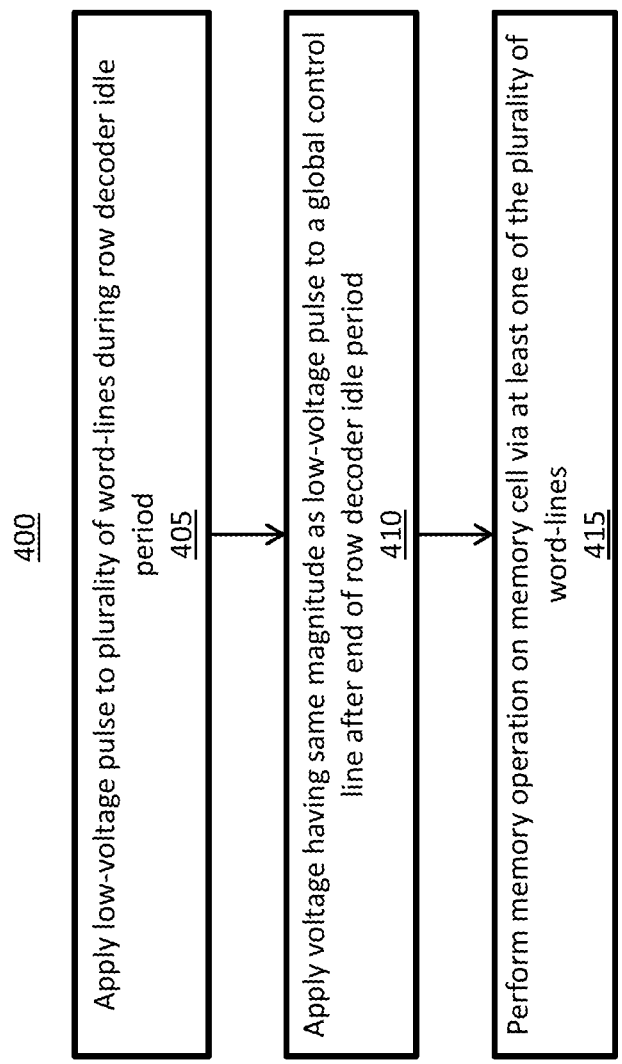
FIG. 4 is a flow diagram of a process for reducing leakage current in a non-volatile memory system, according to an example implementation.

FIG. 4 is a flow diagram of a process 400 for reducing leakage current in a non-volatile memory system, according to an example implementation. In an operation 405, the process 400 can include applying, by a low-voltage generator during an idle period of a row decoder, a low-voltage pulse to a plurality of word-lines of the non-volatile memory. In some implementations, the low-voltage pulse can be selected to pre-charge the word-lines and to reduce a leakage current associated with the application of a programming voltage to the word-lines. Because the leakage can occur in all memory cells or blocks of the non-volatile memory, in some implementations the low-voltage source can apply the low-voltage pulse to every word-line included in the non-volatile memory. In some implementations, the low voltage pulse can have a magnitude in the range of about 0.8 V to about 1.2 V and a duration in the range of about 700 μs to about 900 μs. The low-voltage pulse can end at an end of the idle period of the row decoder. Thus, the pulse is applied only during the row decoder's idle period, and therefore does not require additional time to complete beyond the time that is required to operate the non-volatile memory without applying the low-voltage pulse.

In an operation 410, a voltage source can apply a voltage having substantially the same magnitude as the low-voltage pulse to a global control line after the end of the idle period of the x-decoder. In some implementations, the voltage applied to the global control line can be in the range of about 0.8 V to about 1.2 V. In some implementations, the application of the voltage to the global control line can help to ensure that the pre-charged word-lines remain floating even after the low-voltage pulse is terminated in operation 310.

In an operation 415, a memory operation can be performed on a memory cell of the non-volatile memory via at least one of the plurality of word-lines. In general, the memory operation performed in operation 415 can include any type of operation in which data is accessed or modified within a memory cell. For example, the memory operation can include a read operation, a write operation, or an erase operation. In some implementations, the memory operation can be a programming operation. Typically, such a non-volatile memory may experience current leakage as described above. For example, a leakage current between global control lines and word-line switching circuitry of the unselected blocks of the non-volatile memory may result from application of a programming voltage to an active block of the non-volatile memory. The leakage current can be dependent on source voltage, which may be higher than zero volts in some architectures due to coupling effects from a local interconnect or other structure that can be biased with a voltage during a memory operation. In architectures in which this coupling effect is not present, a lower source voltage of about 0 V may result. This lower source voltage can lead to higher leakage current, which can result in slower programming times as described above. To address this problem, word-lines can be pre-charged to a low voltage prior to a first program operation to compensate for the lack of coupling effects that would normally be expected to increase the source voltage without any pre-charge operations. However, having pre-charged the word-lines through the operations 405 and 410, the memory operation performed in operation 415 can be performed with a reduced amount of leakage.

The foregoing description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
    a plurality of memory cells;
    a plurality of word lines connected to the plurality of memory cells;
    a global control line; and
    a low-voltage generator configured to:
        apply a low-voltage pulse to at least one of the plurality of word lines during a time period prior to a first memory operation of at least one of the plurality of memory cells occurring after power is applied to the plurality of memory cells to pre-charge the at least one word line; and
        apply a voltage having the same magnitude as the low-voltage pulse to the global control line after a conclusion of the low-voltage pulse.

2. The apparatus of claim 1, wherein pre-charging the at least one of the plurality of word lines reduces a leakage current between the at least one of the plurality of word lines and the global control line.

3. The apparatus of claim 1, wherein the application of the voltage having the same magnitude as the low-voltage pulse to the global control line causes the at least one of the plurality of word lines to remain pre-charged at the same magnitude as the low-voltage pulse.

4. The apparatus of claim 1, further comprising a row decoder, wherein the low-voltage generator is configured to supply the low-voltage pulse when the row decoder is idle.

5. The apparatus of claim 1, wherein the time period comprises a time period during a power-on read sequence which includes a read operation, a ROM data loading operation, a bad block management operation, and a bad column replacement operation.

6. The apparatus of claim 5, wherein the low-voltage generator is configured to apply the low-voltage pulse during one of the ROM data loading operation and the bad column replacement operation such that the application of the low-voltage pulse does not increase a duration of the power-on read sequence.

7. The apparatus of claim 1, wherein the low-voltage generator is configured to apply the low-voltage pulse to all of the word-lines in the at least one memory cell.

8. The apparatus of claim 1, wherein the low-voltage pulse has a voltage in the range of about 0.8 V to about 1.2 V.

9. The apparatus of claim 1, wherein the low-voltage pulse has a duration in the range of about 700 microseconds to about 900 microseconds.

10. A system comprising:
a plurality of memory cells;
a plurality of word lines connected to the plurality of memory cells;
a row decoder; and
a low-voltage generator configured to:
apply a low-voltage pulse to all of the plurality of word lines of at least one of the plurality of memory cells to pre-charge the plurality of word lines during a time in which the row decoder is idle; and
apply a word line setup signal having a magnitude greater than that of the low-voltage pulse to activate each of the plurality of memory blocks during a word line setup phase, prior to the low-voltage generator applying the low-voltage pulse.

11. The system of claim 10, further comprising a plurality of memory blocks each including at least one of the plurality of memory cells.

12. The system of claim 10, wherein the low-voltage generator is configured to initiate the low voltage pulse during a word line development phase occurring at the conclusion of the word line setup phase.

13. The system of claim 12, wherein the low-voltage generator is further configured to terminate the low-voltage pulse at the conclusion of the word line development phase.

14. The system of claim 10, wherein the low-voltage generator is configured to apply the low-voltage pulse when the system transitions from a sleeping state to an operational state.

15. The system of claim 10, wherein the low-voltage generator is configured to apply the low-voltage pulse prior to a first memory operation of the plurality of memory cells occurring after power is applied to the plurality of memory cells.

16. A method for reducing leakage in a non-volatile memory, the method comprising:
applying, by a low-voltage generator during an idle period of a row decoder, a low-voltage pulse to a plurality of word-lines of the non-volatile memory;
applying a voltage having the same magnitude as the low-voltage pulse to a global control line after the end of the idle period of the row decoder; and
performing a memory operation on a memory cell of the non-volatile memory via at least one of the plurality of word-lines.

17. The method of claim 16, further comprising initiating, by the low-voltage generator, the low-voltage pulse during a power-on read operation.

18. The method of claim 17, further comprising initiating, by the low-voltage generator, the low-voltage pulse during a ROM data loading operation of the power-on read operation.

19. The method of claim 17, further comprising initiating, by the low-voltage generator, the low-voltage pulse during a bad column replacement operation of the power-on read operation.

20. The method of claim 16, wherein the low voltage pulse has a magnitude in the range of about 0.8 V to about 1.2 V and a duration in the range of about 700 microseconds to about 900 microseconds.

21. An apparatus comprising:
a plurality of memory cells;
a plurality of word lines connected to the plurality of memory cells;
means for applying a low-voltage pulse to at least one of the plurality of word lines during a power-on read operation of at least one of the plurality of memory cells to pre-charge the at least one word line; and
means for applying a voltage having the same magnitude as the low-voltage pulse to a global control line after a conclusion of the low-voltage pulse.

* * * * *